United States Patent [19]

Anzai

[11] Patent Number: 5,410,503
[45] Date of Patent: Apr. 25, 1995

[54] SEMICONDUCTOR MEMORY DEVICE HAVING MEMORY CELLS INCLUDING TRANSISTORS AND CAPACITORS

[75] Inventor: Kenji Anzai, Sagamihara, Japan

[73] Assignee: Nippon Steel Corporation, Tokyo, Japan

[21] Appl. No.: 161,537

[22] Filed: Dec. 6, 1993

Related U.S. Application Data

[62] Division of Ser. No. 49,306, Apr. 21, 1993, Pat. No. 5,292,679.

[30] Foreign Application Priority Data

Apr. 23, 1992 [JP] Japan ................................. 4-130002

[51] Int. Cl.$^6$ ............................................. G11C 11/24
[52] U.S. Cl. .................................. 365/149; 365/189.01
[58] Field of Search ............... 365/149, 189.01, 230.01, 365/150

[56] References Cited

U.S. PATENT DOCUMENTS 5,136,533 8/1992 Harari .................................. 365/149

FOREIGN PATENT DOCUMENTS 63-253660 10/1988 Japan .
1-105567 4/1989 Japan .
2-111062 4/1990 Japan .

OTHER PUBLICATIONS

Takamoto et al., Double Stacked capacitor With Self-Aligned Poly Source/Drain transistor (DSP) Cell For Megabit Dram, IEDM 1987, IEEE pp. 328–331.

Primary Examiner—Terrell W. Fears
Attorney, Agent, or Firm—Pollock, Vande Sande & Priddy

[57] ABSTRACT

A semiconductor memory device having memory cells including a transistor and a trench type capacitor which are formed on a semiconductor substrate to cooperate with each other to store information. The device includes a trench having a bottom made of a first insulator disposed on the semiconductor substrate and a sidewall made of an epitaxial semiconductor layer which is epitaxially grown on the semiconductor substrate in a substantially vertical direction around the first insulator. The capacitor comprises an impurity diffused layer formed on the sidewall of the trench, a second insulator layer formed over thee impurity diffused layer, and a conductive layer opposite of the impurity diffused layer via the second insulator layer, with the transistor formed on the epitaxial semiconductor layer.

2 Claims, 3 Drawing Sheets

SEMICONDUCTOR MEMORY DEVICE HAVING MEMORY CELLS INCLUDING TRANSISTORS AND CAPACITORS

This is a divisional of Ser. No. 08/049,306, filed on Apr. 21, 1993, now U.S. Pat. No. 5,292,679.

FIELD OF THE INVENTION

The present invention relates to a semiconductor memory device such as dynamic random access memory (DRAM) and a process for producing the same.

BACKGROUND OF THE INVENTION

A memory cell of DRAM usually comprises a metal oxide semiconductor (MOS) transistor or metal insulator semiconductor (MIS) transistor and a capacitor. The cell capacitance is determined by the amount of charge stored in the capacitor. Accordingly, in order to provide a sufficient memory cell capacitance even if the memory cell area of the DRAM is reduced, formation of capacitors in grooves which are referred to as trenches in a semiconductor substrate has been recently used. Formation of capacitors around pillars which are left in the subsurface of the semiconductor substrate after etching has been proposed.

The memory cells including the trenches are classified into a trench capacitor structure type in which an inner surface portion of the trench acts as a charge storage node and a polysilicon portion embedded in the trench with an insulator film being intermediate therebetween acts as an opposite electrode and a so-called stacked trench structure type in which a charge storage electrode which is a storage node is formed on an insulator film within the trench and an opposite electrode is formed with a dielectric film disposed on the charge storage electrode.

For example, an improved stacked trench structure is disclosed in Tsukamoto et al. "Double Stacked Capacitor with Self-aligned Poly Source/Drain Transistor (DSP) Cell for Megabit DRAM", PP328-331 IEDM 87 IEEE 1987.

The above mentioned trenches have been heretofore formed by etching a semiconductor substrate.

Processes for producing a memory cell having a trench structure are disclosed in JP-A-02-111062 (Yamada et al) and JP-A-63-253660 (Kiyosumi). A method of forming trenches for trench capacitors is disclosed in JP-A-01-105567 (Motoyama et al).

If trenches are formed in a semiconductor substrate by etching, a number of crystal defects are generated in the semiconductor substrate around the trenches due to etching damage. In the trench capacitor structure in which a charge storage node is defined in the inner surface region of the trench, a leak current may easily conduct, resulting in deterioration of data holding characteristics.

If a device having a reduced memory cell area is formed in order to overcome the problems due to etching damages or the leak current, the data holding capability is further lowered, resulting in that integration degree of devices can not be increased above a predetermined value.

If an etching method having a high fabrication accuracy is adopted to form a finer pattern, etching damages become more serious since a high energy ion assist is needed.

SUMMARY OF THE INVENTION

It is therefore an object of the present invention to provide a semiconductor memory device having memory cells each including a transistor and a capacitor in which crystal defects around trenches are reduced and high density integration is possible, and a process for producing the same.

In order to accomplish the above mentioned object, the present invention provides a semiconductor memory device having memory cells each including a transistor and a capacitor which corporate with each other to store information, comprising: a semiconductor substrate; an insulator having a predetermined thickness which is disposed on the semiconductor substrate; a semiconductor monocrystal layer having a thickness larger than that of the insulator, which is disposed on the semiconductor substrate adjacent to the insulator.

In another aspect of the present invention, there is provided a process for producing a semiconductor memory device having memory cells each including a transistor and a capacitor which cooperate with each other to store information, comprising the steps of: forming an insulator film on a semiconductor substrate in a pattern; selectively epitaxially growing a semiconductor material on the semiconductor substrate using the insulator film as a mask for growth to form an epitaxial layer for relatively forming a trench on the insulator film; and forming the capacitor in the side of said trench.

In a further aspect of the present invention, there is provided a process for producing a semiconductor memory device having memory cells each including a transistor and a capacitor which cooperate with each other to store information, comprising the steps of: forming a first insulator film on a semiconductor substrate in a pattern; selectively epitaxially growing a semiconductor material on the semiconductor substrate using the insulator film as a mask growth to form an epitaxial layer for relatively forming a trench on the first insulator film; forming the capacitor in the side of the trench, forming a charge storage node of the capacitor by introducing an impurity into the inner wall portion of the trench; covering the sidewall of the trench with a second insulator film; and forming on the second insulator film, an electrically conductive film which will become an opposite electrode of the capacitor.

In the process for producing the semiconductor memory device of the present invention, an epitaxial layer is selectively epitaxially grown on a semiconductor substrate by using as a mask, a patterned insulator film which is formed on the semiconductor substrate so that trenches are formed in a portion on the insulator film. Therefore, problem due to the etching damages can be prevented, so that crystal defects around the trenches can be reduced in comparison with the conventional methods using etching. As a result of this, data holding characteristics can be improved since leak currents from the trench portions are reduced.

Since the data holding characteristics can be improved, it will become possible to provide a reduced memory cell area, that is, capacitance of capacitor, resulting in increased integration of devices.

DESCRIPTION OF THE PREFERRED EMBODIMENTS

A semiconductor memory device of the present invention will now be described with reference to a dynamic random access memory (DRAM) including memory cells each comprising a transistor and a capacitor which cooperate with each other to store information.

Figure 1:
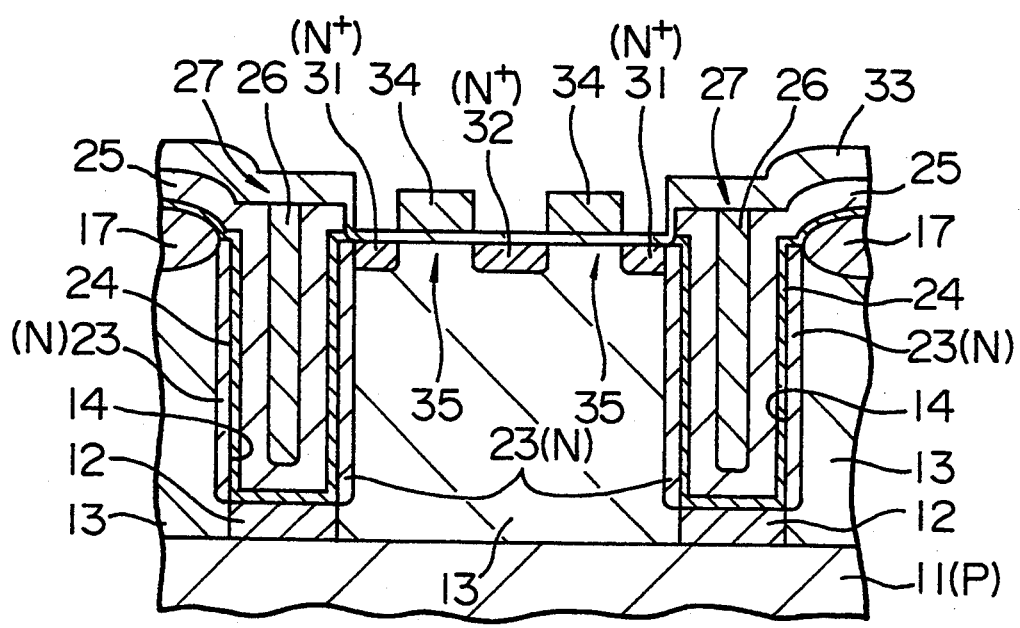
FIG. 1 is an enlarged sectional view showing a main part of a semiconductor memory device of an embodiment of the present invention with its upper structure being omitted.

Referring now to FIG. 1, there is shown a main part enlarged sectional view showing memory cells of a DRAM which is formed on a P type semiconductor substrate 11, with its lid portion including bit lines, passivation film being omitted. As shown in FIG. 1, an insulator 12 having a thickness in the order of 200 to 500 nm and a semiconductor monocrystal layer 13 adjacent to the insulator 12, and having a thickness of about 5 to 10 μm which is larger than that of the insulator 12, are formed on the P type semiconductor substrate 11 so that trench structures are defined by the insulator 12 and the monocrystal layer 13 at the bottom and the sidewall thereof. The monocrystal layer 13 has the same crystal axis direction as the crystal axis of the substrate 11.

Each memory cell of the DRAM comprises a MOS transistor 35 and a capacitor 27. Each MOS transistor 35 is formed on the semiconductor monocrystal layer 13. Each MOS transistor 35 comprises a gate electrode 34; a source 31 and a drain 32 which are disposed with the gate electrode 34 positioned therebetween; and an interlayer insulator 33 which is disposed inbetween the gate electrode and the source and drain. The gate electrode 34 is formed of a polycrystalline silicon layer. The source 31 and the drain 32 are formed of an N+ type semiconductor crystal and the interlayer insulator 33 is made of a silicon oxide (SiO$_2$) layer. A trench 14 is formed adjacent to each transistor 35. The insulator 12 on the P type semiconductor substrate 11 defines the bottom of the trench 14. The end sidewall of the semiconductor monocrystal layer 13 defines the wall of the trench 14.

A capacitor 27 is formed within each of the trenches 14. Each capacitor 27 comprises a storage node 23 which is formed by making the end face of the semiconductor monocrystal layer defining the trench sidewall to have the N conductivity type and a dielectric film which is an ONO (silicon oxide/silicon nitride/silicon oxide) layer 24 covering the sidewall and the bottom of the trench 14 and a cell plate having a polycrystalline silicon film 25 therein.

The source 31 is electrically connected with the storage node 23. The transistor 35 and the capacitor 27 constitute a memory cell.

A semiconductor memory device including a pair of memory cells which are formed in a complementary relationship with each other is shown in FIG. 1.

A process for producing a DRAM having trench capacitor structure memory cells of the present invention will be described with reference to FIGS. 1 to 6.

Figure 2:
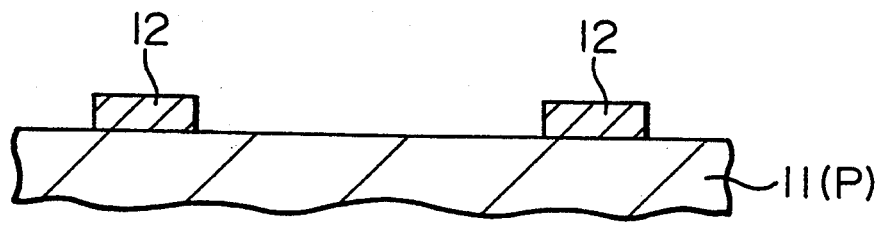
FIG. 2 is an enlarged sectional view illustrating a step for forming a bottom region of a trench in a process for producing the semiconductor memory device shown in FIG. 1.

Firstly, the SiO$_2$ film 12 having a film thickness in the order about 200 to 500 nm is formed over the entire surface of the P type monocrystal silicon semiconductor substrate (hereinafter referred to as Si substrate) by the chemical vapor deposition (CVD) or thermal oxidation method. The SiO$_2$ film 12 is then etched for patterning so that the SiO$_2$ film 12 is left only in regions where trenches are to be formed on the Si substrate 11 as shown in FIG. 2. The insulator 12 which will become a mask may be an Si$_3$N$_4$ film in lieu of the SiO$_2$ film.

Figure 3:
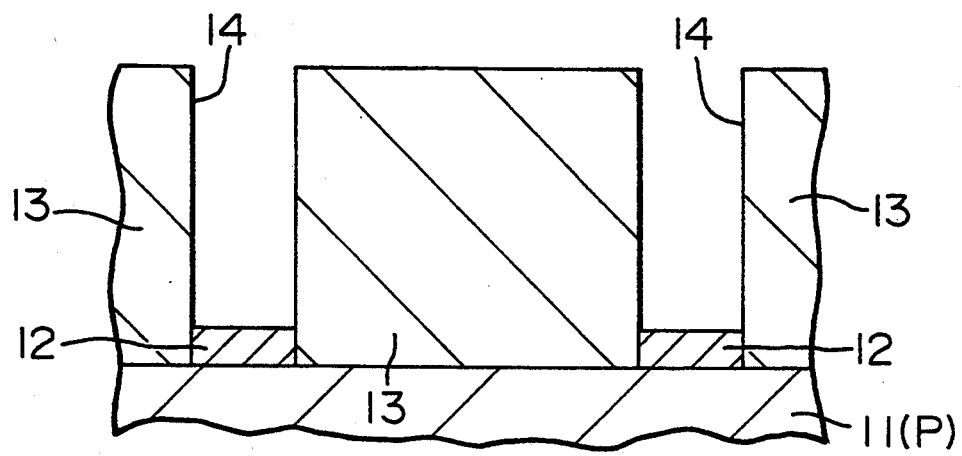
FIG. 3 is an enlarged sectional view illustrating a step for forming a trench semiconductor monocrystal layer in the process for producing the semiconductor memory device shown in FIG. 1.

The P type epitaxial layer 13 is selectively grown to provide a film thickness of about 5 to 10 μm over the Si substrate 11 by thermal decomposition of silane at temperatures of about 1000° to 1200° C. while the SiO$_2$ film is used as the mask. As a result of the above, trenches 14 are relatively formed on the SiO$_2$ film 12 where the epitaxial layer is not grown as shown in FIG. 3.

An SiO$_2$ film 15 is then formed over the entire surface of the epitaxial layer 13 including the inner surface of the trenches 14 and an Si$_3$N$_4$ film 16 which is an oxidation resistant film is then formed over the SiO$_2$ film 15. The Si$_3$N$_4$ film 16 and the SiO$_2$ film 15 are etched for patterning by the photolithography to leave the Si$_3$N$_4$ film 16 and the SiO$_2$ film 15 over the region where active regions are to be formed in the epitaxial layer 13.

Figure 4:
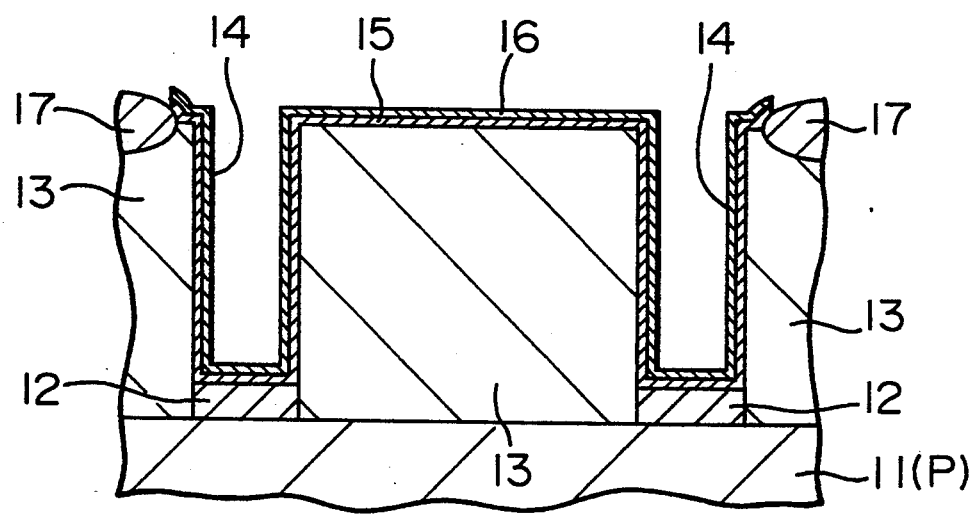
FIG. 4 is an enlarged sectional view illustrating a step for forming a field oxide film in the process for producing the semiconductor memory device shown in FIG. 1.

Thereafter, a field oxide film 17 is formed at field region in the epitaxial layer 13 by the selective oxidation using the Si$_3$N$_4$ film 16 as a mask, as shown in FIG. 4. At this time, the field region is formed in such a manner that each trench 14 is completely included in the active region.

Figure 5:
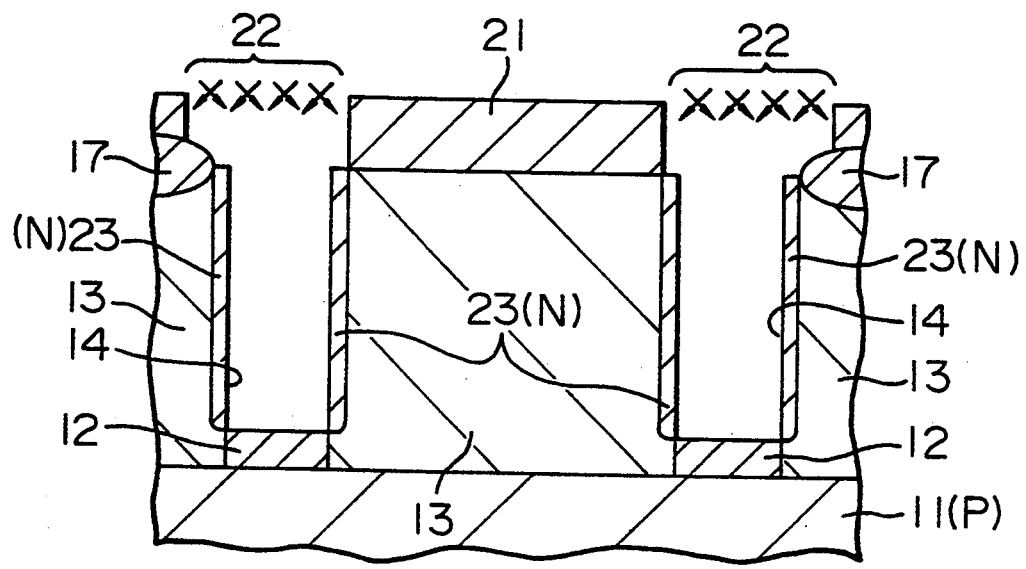
FIG. 5 is an enlarged sectional view illustrating a step for forming a trench sidewall in the process for producing the semiconductor memory device shown in FIG. 1.

After the Si$_3$N$_4$ film 16 and then the SiO$_2$ film 15 have been removed with hot phosphoric acid, a resist 21 is applied on the epitaxial layer 13 in such a pattern that only the trenches 14 and the areas adjacent thereto are exposed. An N type layer 23 is formed on the sidewall of each trench 14 by introducing impurities 22 into the sidewall of the trench 14 and a portion in the vicinity thereof at a dose of about $10^{13}$ to $10^{14}$ cm$^{-2}$ by the oblique ion implantation method using the resist 21 as the mask, as shown in FIG. 5. This impurity introducing may be conducted by the other methods such as solid phase diffusion.

After the resist 21 has been removed by incineration with oxygen plasma, the ONO film 24 is formed over the entire surface including the inner surface of the trenches 14 and the polycrystalline silicon film 25 is then formed on the ONO film 24. After the polycrystalline silicon film 25 has been formed, the recesses which remain in the trenches 14 are filled with the polycrystalline silicon film 26 by the low pressure CVD and the like. An SiO$_2$ film may be used in lieu of the polycrystalline silicon film 26 for filling the recesses in the trenches.

Figure 6:
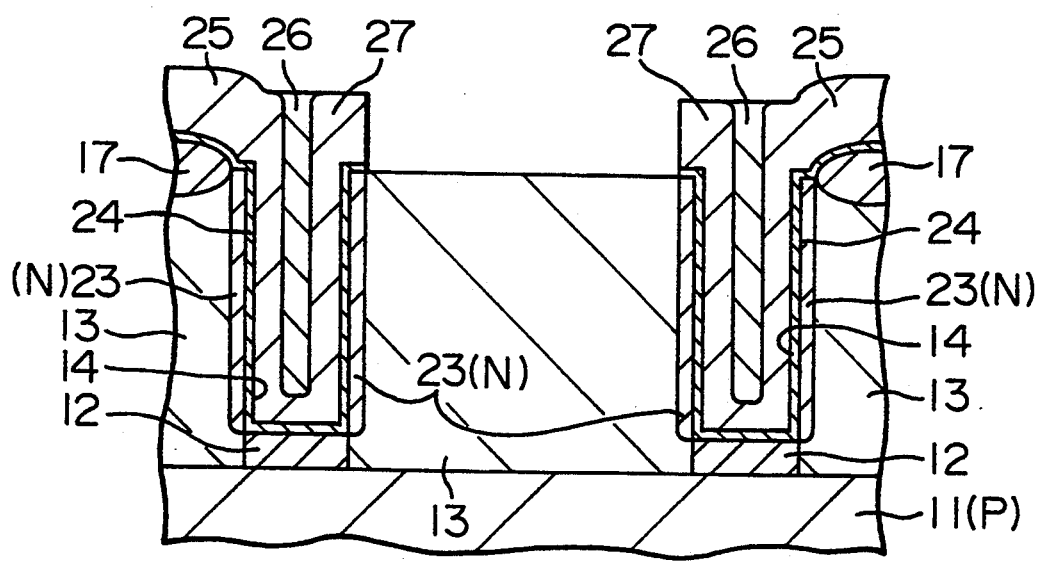
FIG. 6 is an enlarged sectional view illustrating a step for forming a capacitor in the process for producing the semiconductor memory device shown in FIG. 1.

Subsequently, as illustrated in FIG. 6, the polycrystalline silicon film 25 and the ONO film 24 are etched to have patterns with apertures only at the regions where transistors are to be formed. This provides capacitors 27 in which the N type layers 23 serve as charge storage nodes, the ONO films 24 serve as capacitor dielectric films and the polycrystalline silicon films 25 and 26 serve as opposite electrodes, so called cell plates.

Then, an SiO$_2$ film 33 is formed by thermal oxidation on the surfaces of the epitaxial layer 13 at regions which are not covered with the polycrystalline silicon film 25 and on the surfaces of the polycrystalline silicon films 25 and 26. Since the polycrystalline silicon films 25 and 26 have a higher oxidation rate than the epitaxial layer 13, the thickness of the SiO$_2$ film 33 on the surfaces of the polycrystalline silicon films 25 and 26 is larger than that of the SiO$_2$ film 33 on the surface of the epitaxial layer 13. The SiO$_2$ film 33 on the epitaxial layer 13 will become the gate oxide film of MOS transistors.

Although illustration of the subsequent process is omitted, a polycrystalline silicon film 34 is covered with an interlayer insulator film and bit lines which are in contact with N+ layer 32 are formed on the interlayer insulator film and the bit lines are covered with a passivation film to complete a DRAM having memory cells of the trench capacitor structure.

In the illustrated example, two memory cells including a pair of MOS transistors having a common drain, which function as access transistors for corresponding capacitors 27, are formed in one active region.

Since it is not necessary to conduct etching to form trenches 14 in accordance with the above mentioned producing process, crystal defects are remarkably reduced in the epitaxial layer 13 which is formed with the trenches 14. Accordingly, a leak current is reluctant to flow through the epitaxial layer 13. Therefore, the N type layers 23 forming storage nodes of the capacitors allow only reduced leak currents, resulting in excellent data holding characteristics.

Since the leak current is restricted to flow through the epitaxial layer 13, it is possible to form memory cells having reduced areas. Accordingly, it is possible to provide high integrated DRAMs.

Having described the example of a process for producing memory cells of the present invention having a trench capacitor structure, it is to be understood that the present invention can be applicable to processes for producing memory cells having other structures with trenches and that the present invention is also applicable to semiconductor memory device of a pillar structure in which capacitors are formed on the wall of pillars, that is, convex wall formed in a semiconductor monocrystal layer.

Since it is not necessary to conduct etching to form trenches in accordance with the process for producing semiconductor memory devices of the present invention, the crystal defects in the vicinity of trenches can be reduced as compared with prior art semiconductor memory devices. As a result of this, because of low leak currents from the trenches, semiconductor memory devices having excellent data holding characteristics can be provided.

Since the data holding characteristics becomes excellent, the area of memory cells can be reduced so as to increase integration of device.

I claim:

1. A semiconductor memory device having memory cells, each of said memory cells including a transistor and a trench type capacitor which are formed on a semiconductor substrate to cooperate with each other to store information, said device including a trench having:

a bottom made of a first insulator disposed on said semiconductor substrate; and a sidewall made of an epitaxial semiconductor layer which is epitaxially grown on said semiconductor substrate in a substantially vertical direction around said first insulator;

said capacitor comprising:

an impurity diffused layer being formed on said sidewall of said trench;

a second insulator layer formed over said impurity diffused layer; and a conductive layer positioned opposite to said impurity diffused layer via said second insulator layer, and said transistor being formed on said epitaxial semiconductor layer.

2. The semiconductor memory device as defined in claim 1, wherein said epitaxial semiconductor layer has the same conductivity type as that of said semiconductor substrate.

* * * * *